United States Patent
Diemer et al.

(10) Patent No.: US 9,437,394 B1
(45) Date of Patent: Sep. 6, 2016

(54) METHOD OF OPERATING A CHARGED PARTICLE MICROSCOPE AND CHARGED PARTICLE MICROSCOPE OPERATING ACCORDING TO SUCH METHOD

(71) Applicants: Carl Zeiss Microscopy GmbH, Jena (DE); Carl Zeiss Microscopy Ltd., Cambridge (GB)

(72) Inventors: Simon Diemer, Roettingen (DE); Janina Schulz, Munich (DE); Emanuel Heindl, Aalen (DE); David Roddom, Linton Cambridge (GB)

(73) Assignees: CARL ZEISS MICROSCOPY LTD., Cambridge (GB); CARL ZEISS MICROSCOPY GMBH, Jena (DE)

( * ) Notice: Subject to any disclaimer, the term of this patent is extended or adjusted under 35 U.S.C. 154(b) by 0 days.

(21) Appl. No.: 14/228,391

(22) Filed: Mar. 28, 2014

(51) Int. Cl.
G01N 23/00 (2006.01)
H01J 37/21 (2006.01)
H01J 37/26 (2006.01)

(52) U.S. Cl.
CPC .............. *H01J 37/21* (2013.01); *H01J 37/263* (2013.01)

(58) Field of Classification Search
CPC ........ H01J 37/00; H01J 37/02; H01J 37/023; H01J 37/15; H01J 37/21; H01J 37/302
USPC .............. 250/306, 307, 311, 491.1; 382/255, 382/263, 266, 269, 274, 275
See application file for complete search history.

(56) References Cited

U.S. PATENT DOCUMENTS

| 4,567,369 A | 1/1986 | Smith et al. |
| 6,025,600 A | 2/2000 | Archie et al. |
| 6,476,398 B1 | 11/2002 | Xu et al. |
| 2005/0006598 A1* | 1/2005 | Pearl ................... H01J 37/1471 250/492.1 |
| 2005/0072920 A1* | 4/2005 | Inada ..................... G01N 23/04 250/311 |
| 2008/0075381 A1* | 3/2008 | Ishimaru ................. G06T 5/003 382/266 |
| 2008/0175507 A1* | 7/2008 | Lookingbill et al. ......... 382/255 |

OTHER PUBLICATIONS

Batten, ChristopherF. ,"Autofocusing and Astigmatism Correction in the Scanning Electron Microscope", Dissertation, Cambridge, 2000, pp. 1-89.
Erasmus, S.J. et al.,"An automatic focusing and astigmatism correction system for the STEM and CTEM", Journal of Microscopy, vol. 127, Pt. 2, 1982, pp. 185-199.

(Continued)

*Primary Examiner* — Jason McCormack
(74) *Attorney, Agent, or Firm* — Morris & Kamlay LLP

(57) ABSTRACT

A method of operating a charged particle microscope comprises: providing settings of a focus, an x-stigmator and an y-stigmator of the charged particle microscope; and then repeatedly performing adjusting the charged particle microscope to the settings, recording an image of an object using the settings, determining a sharpness measure from the recorded image, and changing at least one of the settings of the focus, the x-stigmator and the y-stigmator based on the sharpness measure until a stop criterion is fulfilled. Herein, the determining of the sharpness measure comprises: determining an orientation of an intensity gradient at each of a plurality of locations within one of the recorded image and a processed image generated by processing the recorded image, and determining the sharpness measure based on the plurality of determined orientations.

29 Claims, 10 Drawing Sheets

(56) References Cited

OTHER PUBLICATIONS

Ong, K,H. et al.,"A Robust Focusing and Astigmatism Correction Method for the Scanning Electron Microscope—Part III: An Improved Technique", Scanning, vol. 20, No. 5, 1998, pp. 357-375.
Ong, K.H. et al.,"A Robust Focusing and Astigmatism Correction Method for the Scanning Electron Microscope", Scanning, vol. 19, No. 8, 1997, pp. 553-563.
Ong, K.H. et al.,"A Robust Focusing and Astigmatism Correction Method for the Scanning Electron Microscope—Part II: Autocorrelation-Based Coarse Focusing Method", Scanning, vol. 20, No. 4, 1998, pp. 324-334.
Rudnaya, M.,""Sharpness Functions for Computational Aesthetics and Image Sublimation"", IAENG International Journal of Computer Science, 38:4, IJCS_38_4_05, 2011, pp. 1-9.
Rudnaya, M.,"Automated focusing and astigmatism correction in electron microscopy", Dissertation, Eindhoven, 2011, pp. 1-153.
Rudnaya, M.E. et al.,"Defocus and twofold astigmatism correction in HAADF-STEM", Ultramicroscopy, vol. 111 , 2011, pp. 1043-1054.
Rudnaya, M.E. et al.,"Derivative-free optimization for autofocus and astigmatism correction in electron microscopy", 2nd International Conference on Engineering Optimization, 2010, pp. 1-10.
Suganuma, T.,"A novel method method for automatic measurement and correction of astigmatism in the SEM", Journal of Physics E: Scientific Instruments, vol. 20, 1987, pp. 67-73.

* cited by examiner

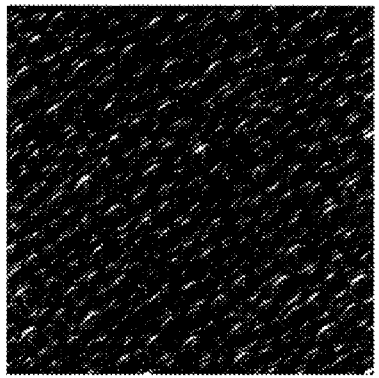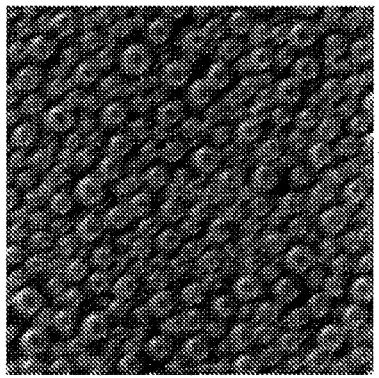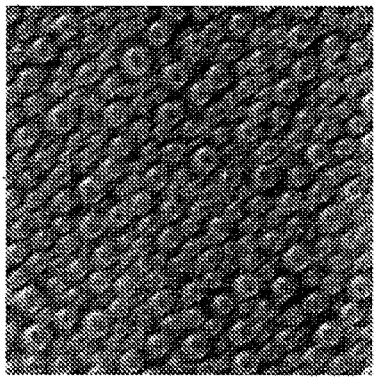
FIG. 9A
FIG. 9B
FIG. 9C
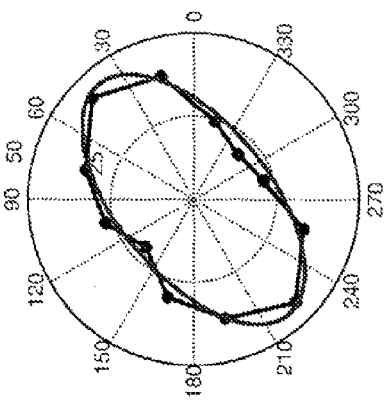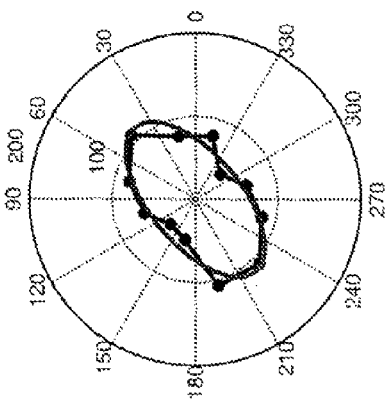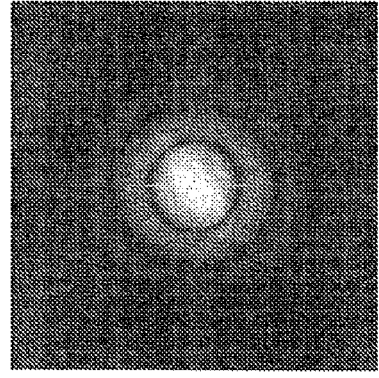
FIG. 9D
FIG. 9E
FIG. 9F

METHOD OF OPERATING A CHARGED PARTICLE MICROSCOPE AND CHARGED PARTICLE MICROSCOPE OPERATING ACCORDING TO SUCH METHOD

FIELD

The present invention relates to methods of operating a charged particle microscope and to charged particle microscopes operating according to such methods. In particular, the present invention relates to methods of focusing a charged particle microscope.

BACKGROUND

A charged particle microscope is used to record an image of an object by scanning a focused charged particle beam across a surface of the object and by detecting secondary particles released from the object by the incident beam in dependence of a scanning position of the beam. In order to obtain a high quality image, it is necessary to correctly focus the charged particle beam on the object surface. The charged particle beam is well focused when the beam forms a small circular beam spot on the object surface. The charged particle microscope typically comprises at least one focusing lens, an x-stigmator and an y-stigmator traversed by the particle beam. The at least one focusing lens includes an objective lens, and the particle beam is focused at a working distance from the objective lens. The focusing of the particle beam on the object can be adjusted by changing the excitations of the at least one focusing lens, the x-stigmator and the y-stigmator and by changing a distance at which the object surface is positioned from the objective lens. The x- and y-stigmators affect an astigmatism of the beam such that the shape of the beam spot formed on the object surface deviates from the circular shape if the x- and y-stigmators are not correctly excited even when the object surface is positioned at the working distance from the objective lens.

In practice, it is difficult to find the optimum excitations of the x- and y-stigmators and of the focusing lens at a given distance of the object surface from the objective lens since the size of the beam spot on the object surface is a complicated non-linear function of the excitations of the at least one focusing lens and the x- and y-stigmators. Therefore, even experienced users require a significant amount of time to obtain a satisfying focusing of the particle beam in an iterative procedure in which the excitations of the at least one focusing lens and the x- and y-stigmators are changed according to a trial and error method.

The present invention has been made taking the above considerations into account.

SUMMARY

Embodiments of the present invention provide automatic focusing methods for charged particle microscopes and charged particle microscopes allowing automatic focusing.

According to exemplary embodiments, a method of operating a charged particle microscope comprises: providing settings of a focus, an x-stigmator and an y-stigmator of the charged particle microscope; and then repeatedly performing adjusting the charged particle microscope to the settings, recording an image of an object using the settings, determining a sharpness measure from the recorded image, and changing at least one of the settings based on the sharpness measure until a stop criterion is fulfilled; wherein the determining of the sharpness measure comprises: determining an orientation of an intensity gradient at each of a plurality of locations within one of the recorded image and a processed image generated by processing the recorded image, and determining the sharpness measure based on the plurality of determined orientations.

According to other exemplary embodiments, a method of operating a charged particle microscope comprises: providing settings of a focus, an x-stigmator and an y-stigmator of the charged particle microscope; and then repeatedly performing adjusting the charged particle microscope to the settings, recording an image of an object using the settings, determining a sharpness measure from the recorded image, and changing at least one of the settings based on the sharpness measure until a stop criterion is fulfilled; wherein the determining of the sharpness measure comprises: generating a Fourier transformed image by Fourier transforming one of the recorded image and a processed image generated by processing the recorded image; determining image properties depending on an orientation within the Fourier transformed image; and determining the sharpness measure based on the determined image properties.

The methods are iterative methods to determine settings of the focus, the x-stigmator and the y-stigmator such that the focusing of the charged particle beam is at an optimum determined by the respective method. This does not exclude that even better settings for focusing the beam could be found in a certain situation as it is the case in any optimization situation where the optimization method settles at a local optimum while a better, absolute optimum exists.

According to particular embodiments, the changing of the settings based on the sharpness measure is performed using an optimization method for non-linear functions having plural parameters, wherein the values of the settings of the focus, the x-stigmator and the y-stigmator are used as the parameters of the non-linear function. According to exemplary embodiments herein, the optimization method is a downhill simplex method.

Such optimization method can be successful if the sharpness measure which is supplied to the optimization method is designed such that the sharpness measure is higher when the recorded image is "better". Herein, it is assumed that the particle beam which is in a "better" focusing state allows to record the "better" image. Implementations of the method may use a representation of the sharpness measure such that greater values of the representation represent higher sharpness measures, and the optimization may include changing the settings such that the representation of the sharpness measure is maximized. This does not exclude that other implementation of the method use a representation of the sharpness measure such that smaller values of the representation represent higher sharpness measures, and the optimization may include changing the settings such that the representation of the sharpness measure is minimized.

The inventors have found that the sharpness measure obtained by determining an image property depending on an orientation within the recorded image or an image derived from the recorded image is well-suited for this purpose. The image derived from the recorded image can be obtained by Fourier transforming the recorded image.

According to exemplary embodiments, the image property depending on an orientation within the recorded image can be determined by determining an orientation of an intensity gradient at each of a plurality of locations within one of the recorded image.

According to other exemplary embodiments, the image property depending on the orientation within the derived image can be determined by determining a first orientation such that a function depending on the orientation as an argument has a minimum at the first orientation, wherein the function depends on image intensities at each of a plurality of locations within the Fourier transformed image located, with respect to a center of the Fourier transformed image, within an orientation interval about the orientation argument.

According to particular embodiments herein, the function includes calculating a sum of the image intensities at each of the plurality of locations within the Fourier transformed image located within the orientation interval about the orientation argument.

According to further particular embodiments herein, the determining of the sharpness measure comprises determining a second orientation such that the function depending on the orientation as an argument has a maximum at the second orientation, and wherein the sharpness measure depends on a value of the function at the maximum.

According to some embodiments, this determination is based on the recorded image, and the orientation of the intensity gradient can be determined at each pixel of the image or a subset of these pixels.

According to other embodiments, this determination is based on a processed image generated by processing the recorded image. The processing may comprise a smoothing step, and the processing may also comprise a generation of a Fourier transform of the recorded image or the recorded image to which a smoothing step is applied. Again, the orientations of the intensity gradients can be determined at each pixel of the processed image, or at a subset of these pixels.

The intensity gradients can be determined by any suitable image processing method, such as applying a Sobel operator to the image.

According to some particular embodiments, the determining of the sharpness measure comprises determining a first orientation such that a function depending on the orientation as an argument has a minimum at the first orientation, wherein the function depends on a number of locations of the plurality of locations at which the determined orientation of the intensity gradient is within an orientation interval about the orientation argument.

This means that the value of the function for a given orientation argument can be calculated by counting the number of locations at which the orientation of the intensity gradient is within a small orientation interval, such as 5 degrees or 10 degrees, 20 degrees or 30 degrees about the orientation argument.

According to particular embodiments herein, the function depends on a sum of amounts of the intensity gradients at the locations at which the determined orientations of the intensity gradient is within the orientation interval about the orientation argument.

This means, that both the orientation and the amount of the intensity gradient is calculated for each location. The value of the function for a given orientation argument can be calculated, for example, by adding the amounts of the intensity gradients for those locations which lie within a small orientation interval about the orientation argument.

According to further particular embodiments herein, the function depends on an average of amounts of the intensity gradients at the locations at which the determined orientation of the intensity gradient is within the orientation interval about the orientation argument.

According to some embodiments, the sharpness measure is a monotonic function of the value of the function at the minimum.

According to particular embodiments, the sharpness measure is proportional to the value of the function at the minimum.

Moreover, according to some further particular embodiments, the determining of the sharpness measure comprises determining a second orientation such that the function depending on the orientation as an argument has a maximum at the second orientation, and wherein the sharpness measure depends on a value of the function at the maximum.

According to particular embodiments herein, the sharpness measure is inversely proportional to the value of the function at the maximum.

The stop criterion which has to be fulfilled for terminating the iterative method can be any suitable criterion. According to some embodiments, the stop criterion is fulfilled when a difference between the value of the function at the maximum and the value of the function at the minimum is below a predetermined threshold.

According to other embodiments, the stop criterion is fulfilled when the absolute value of a difference between the sharpness measure of a repetition and the sharpness measure of a previous repetition is below a threshold.

When the stop criterion has been fulfilled and the iterative process has come to an end, it can be assumed that an optimal focusing of the particle beam has been found. According to some embodiments, one or more images are recorded with the obtained settings of the focus, the x-stigmator and the y-stigmator.

According to further exemplary embodiments, a charged particle microscope comprises a charged particle source generating a charged particle beam; at least one focusing lens traversed by the charged particle beam, the at least one focusing lens including an objective lens focusing the charged particle beam at a working distance from the objective lens; an x-stigmator traversed by the particle beam; an y-stigmator traversed by the particle beam; an object mount configured to hold the object at a distance from the objective lens; and a controller configured to provide settings of a focus, an x-stigmator and an y-stigmator of the charged particle microscope and to repeatedly perform: adjusting the charged particle microscope to the settings by adjusting at least one of an excitation of the at least one focusing lens and a distance of the object mount from the objective lens according to the setting of the focus, adjusting an excitation of the x-stigmator according to the setting of the x-stigmator, and adjusting an excitation of the y-stigmator according to the setting of the y-stigmator, recording an image of an object using the settings, determining a sharpness measure from the recorded image, and changing at least one of the settings based on the sharpness measure, until a stop criterion is fulfilled; wherein the determining of the sharpness measure comprises: determining an image property depending on an orientation within one of the recorded image, a processed image generated by processing the recorded image, and a Fourier transformed image generated by Fourier transforming one of the recorded image and the processed image, and determining the sharpness measure based on the determined image property.

BRIEF DESCRIPTION OF THE DRAWINGS

The foregoing as well as other advantageous features of the disclosure will be more apparent from the following detailed description of exemplary embodiments with reference to the accompanying drawings. It is noted that not all possible embodiments necessarily exhibit each and every, or any, of the advantages identified herein.

FIGS. 5A to 5F, 7A-7F, 8A-8F, 9A-9F, and 10A-10F show images and diagrams for obtaining a sharpness measure obtained for a same sample at different settings.

DETAILED DESCRIPTION OF EXEMPLARY EMBODIMENTS

Figure 1:
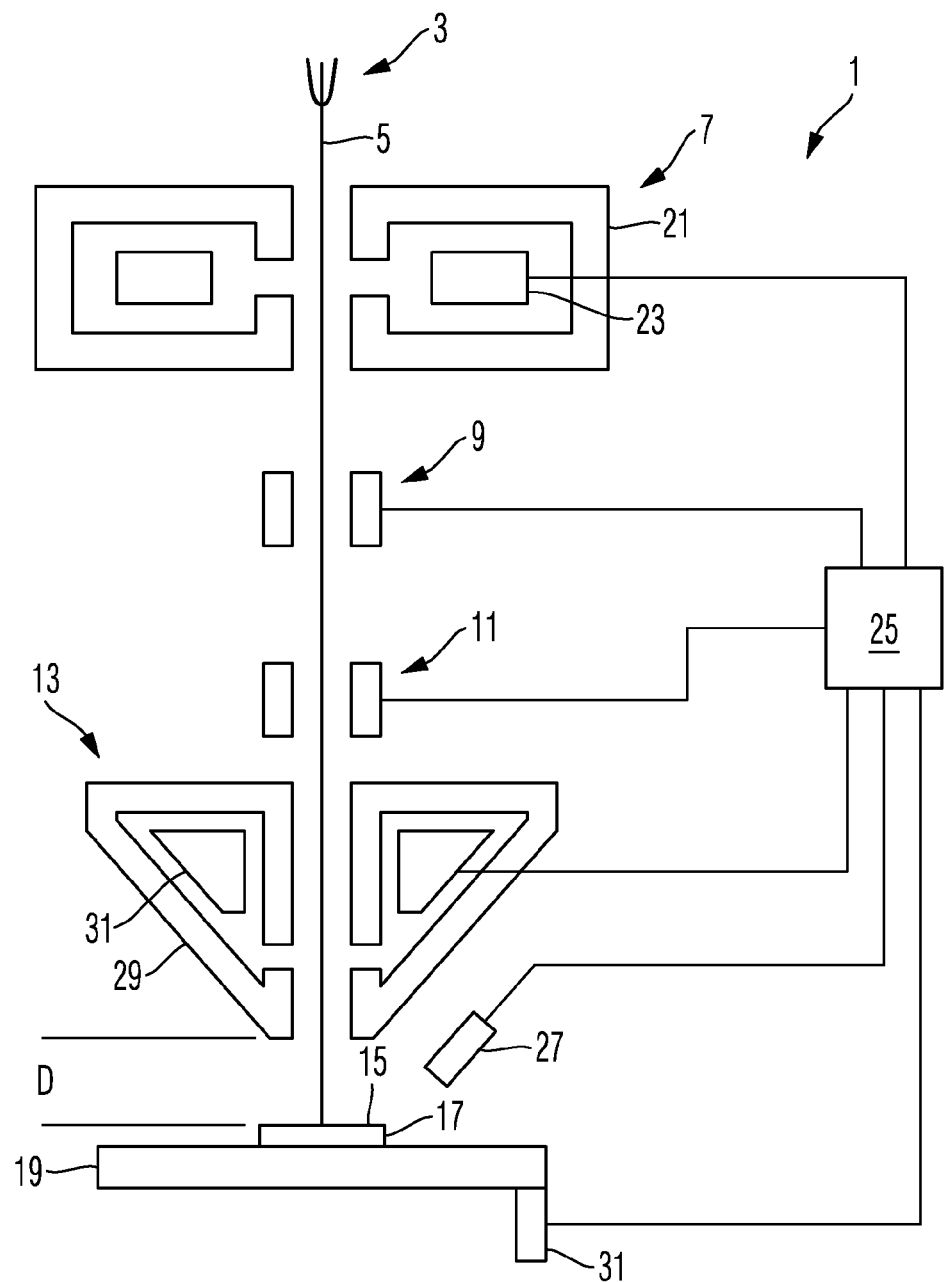
FIG. 1 is a schematic illustration of a charged particle microscope.

In the exemplary embodiments described below, components that are alike in function and structure are designated as far as possible by alike reference numerals. Therefore, to understand the features of the individual components of a specific embodiment, the descriptions of other embodiments and of the summary of the disclosure should be referred to.

FIG. 1 is a schematic illustration of a scanning electron microscope 1 as an example of a charged particle microscope. The electron microscope comprises an electron beam source 3 generating an electron beam 5 traversing a condenser lens 7, an x-y-stigmator 9, a beam deflector 11, and an objective lens 13 to be incident on a surface 15 of an object 17 which is mounted on an object mount 19.

The condenser lens 7 is a magnetic condenser lens having a yoke 21 and a coil 23 energized or excited by a controller 25.

The x-y-stigmator is an electrostatic stigmator having a plurality of, for example eight, electrodes distributed about the electron beam 5, wherein the electrodes are energized or excited by the controller 25. Four of these electrodes form an x-stigmator, and four other of these eight electrodes form a y-stigmator. Each of the x-stigmator and the y-stigmator can generate a quadrupole field with its four electrodes. Alternatively, the x-y-stigmator may comprise eight magnetic coils energized by the controller in order to generate quadrupole fields of a x-stigmator and a y-stigmator.

The x-y-stigmator provides the functions of both an x-stigmator and an y-stigmator in order to change an astigmatism of the particle beam.

The beam deflector 11 can be a magnetic or electrostatic beam deflector which is controlled by the controller 25 in order to scan a location of incidence of the particle beam 5 on the object 17 across the object surface. An electron detector 27 is provided to detect secondary electrons and backscattered electrons originating from the location of incidence of the beam 5 on the object surface 15. The controller 25 is configured to associate electron intensities detected with the electron detector 27 with locations of incidence of the beam 5 on the object surface 15 according to the deflection state of the beam deflector 11 in order to record an image of the object 17.

The objective lens 13 comprises a yoke 29 and a coil 31 energized or excited by the controller 25. The condenser lens 7 and the objective lens 13 focus the beam such that its minimum diameter, i.e. the beam focus, is generated at a distance D from the objective lens 13 if the x-stigmator and y-stigmator are adjusted such that the cross-section of the beam has a circular shape at the beam focus. A sharp image can be recorded if the surface 15 of the object 17 is located at the beam focus, i.e. the distance D away from the object lens. The distance D is also referred to as the working distance.

The object mount 19 comprises an actuator 31 controlled by the controller 25 configured to change the position of the object 17 along the direction of the beam 5. Thus, the controller 25 may change the excitation of the condenser lens 7 and the objective lens 13 or the position of the object 17 in order to focus the beam 5 on the object surface.

In practice, it is difficult to find settings of the focus, the x-stigmator and the y-stigmator such that the beam spot formed on the object surface 15 has a circular shape and its minimum diameter.

Figure 2:
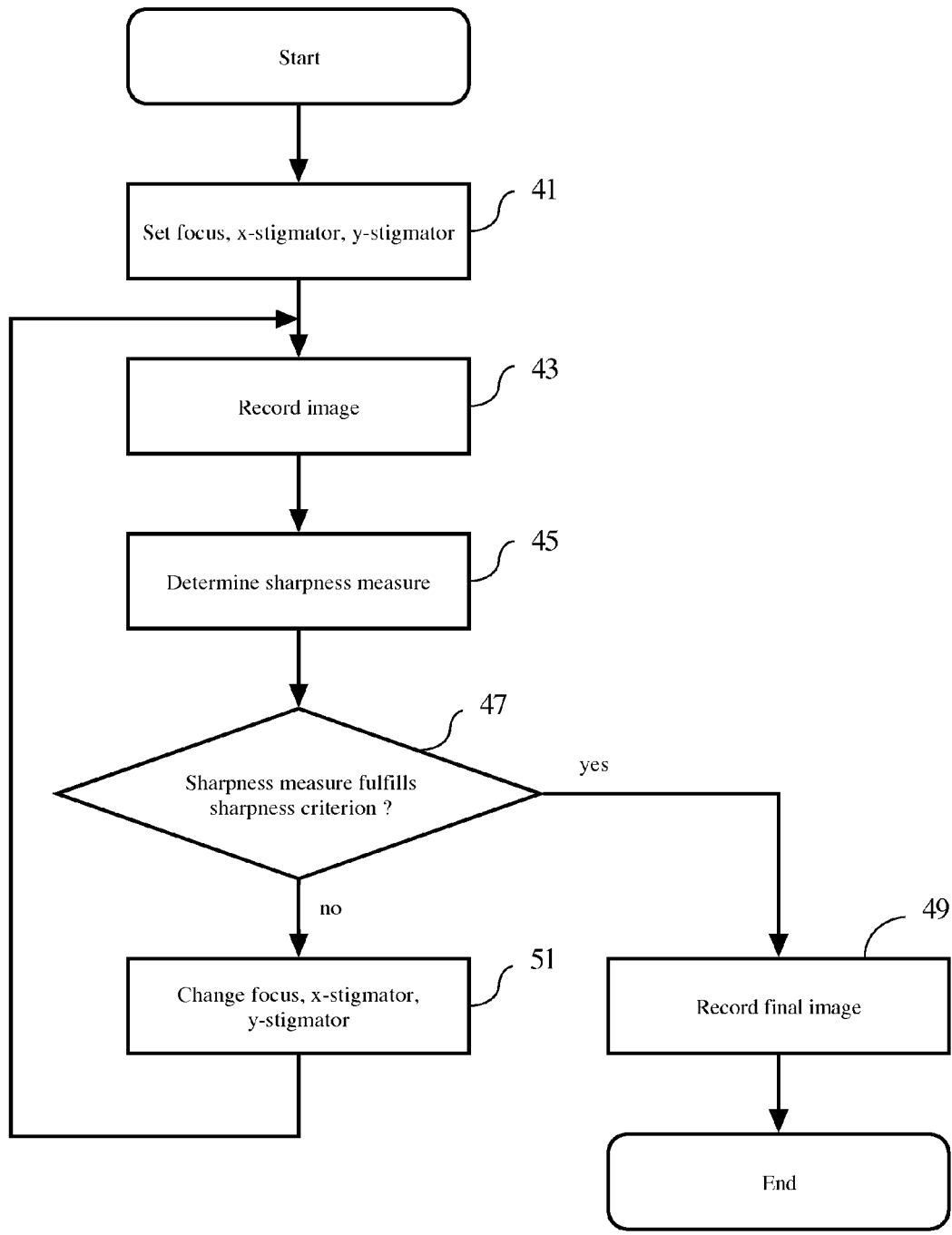
FIG. 2 is a flowchart of a method of adjusting a focusing of a charged particle microscope.

FIG. 2 is a flowchart of a method for automatically adjusting the focusing of the beam 5 on the surface 15 of the object 17. The method starts after the object 17 has been mounted in front of the objective lens 13 and parameters, such as a kinetic energy of the electrons of the beam 5 incident on the sample and a beam current of the beam 5 have been selected according to the circumstances. An initial setting of the focus, the x-stigmator and the y-stigmator is selected in a step 41. The selection of the initial setting can be based on prior experience taking parameters of the microscope 1, such as the kinetic energy and the beam current into account. The setting of the focus may include adjusting excitations of the focusing lenses 7 and 13 by the controller 25 and changing the distance of the object 17 from the objective lens 13 by operating the actuator 31 controlled by the controller 25. The setting of the x-stigmator and the y-stigmator involves adjusting of the excitation of the x-y-stigmator 9 by the controller 25. An image is recorded in a step 43 with the microscope 1, wherein the setting adjusted in step 41 is used.

A sharpness measure is determined in a step 45. The sharpness measure is a value or a set of values derived from the recorded image by performing an image analysis, wherein the sharpness measure characterizes the sharpness of the recorded image. In the illustrated example, a "higher" sharpness measure indicates that the sharpness of the analyzed recorded image is "better". In a step 47, it is decided whether the determined sharpness measure fulfills a stop criterion. If the stop criterion is fulfilled, this indicates that a satisfying focusing of the beam on the object surface has been achieved, and a final image of the object 17 is recorded in a step 49. The final image can be, for example, displayed on a display device, such as a computer screen, stored in a storage device, such as a magnetic or optical disk, or sent to a desired destination via a data network. Thereafter, the method is terminated. It is to be noted that it is also possible to use the last image recorded in step 43 as the final image if this image already fulfills the given quality requirements. Otherwise, the final image is recorded in the step 49, wherein this image may be recorded using a scan rate, pixel dwell time, and an image size different from the image recorded in step 43.

If the stop criterion is not fulfilled in step 47, the focus, x-stigmator and y-stigmator are changed in a step 51 and the method proceeds to step 43 in order to repeat the recording of a new image in step 43, the determining of the sharpness measure in step 45 and the decision in step 47.

For the changing of the focus, the x-stigmator and the y-stigmator in step 51 it is necessary to determine new values of the focus, x-stigmator and y-stigmator. These new values can be determined using an optimization method. Any suitable optimization method can be used for this purpose. In the illustrated example, the downhill simplex method of John Nelder and Roger Mead is used. The optimization method suggests new values of the focus, x-stigmator and y-stigmator based on the determined sharpness measure and previous settings of the focus, x-stigmator and y-stigmator.

In order to achieve a successful optimization of the focus, x-stigmator and y-stigmator, it is necessary that the used sharpness measure correctly characterizes the sharpness of the image.

This will be illustrated with reference to FIGS. 3A to 3D below.

These Figures illustrate difficulties which may occur in an optimization method based on a sharpness measure which appears to characterize the sharpness of an image well, but which is disadvantageous in practice. In the example illustrated with reference to FIGS. 3A to 3C it is assumed that the sharpness measure is calculated by determining the amounts of intensity gradients in a recorded image and by determining the variance of the amounts of the intensity gradients. The variance is used as the sharpness measure. This calculation of the sharpness measure appears to be useful since a sharper image is known to have high variations in the intensity gradients while an unsharp image having a smoother appearance has a lower variations of the intensity gradients.

An optimization method changes the parameters which are to be optimized, i.e. the focus, x-stigmator and y-stigmator, such that the sharpness measure reaches a maximum. In FIGS. 3A to 3D it is assumed that the optimum value of the focus is at the WDopt, that the optimum value of the x-stigmator is at 0.0 and the optimum value of the y-stigmator is also at 0.0.

Figure 3A:
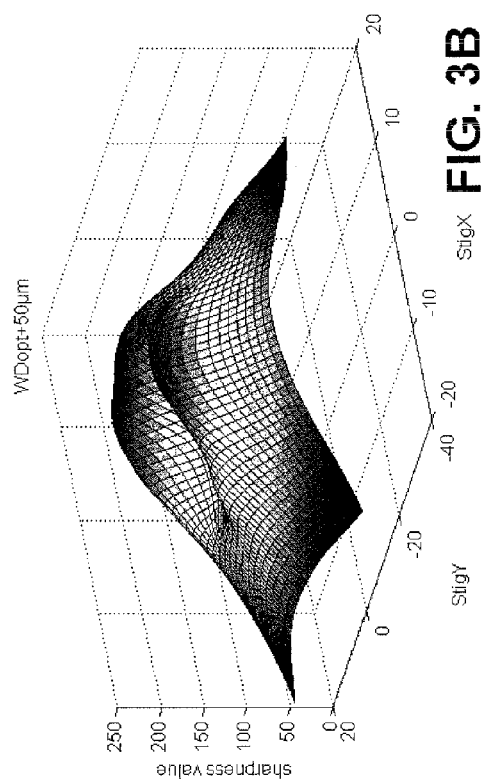
FIGS. 3A to 3D are graphs illustrating a sharpness measure according to a comparative example.

FIG. 3A is a graph showing values of the sharpness measure in dependence of the setting of the x-stigmator and the y-stigmator when the focus is already at the optimum setting WDopt. It is apparent that an optimization method will be able to find the optimum values for the x-stigmator and the y-stigmator from any initial setting of the x-stigmator and the y-stigmator. It follows that the illustrated sharpness measure is useful at least when the setting of the focus is already at the optimum setting.

Figure 3B:
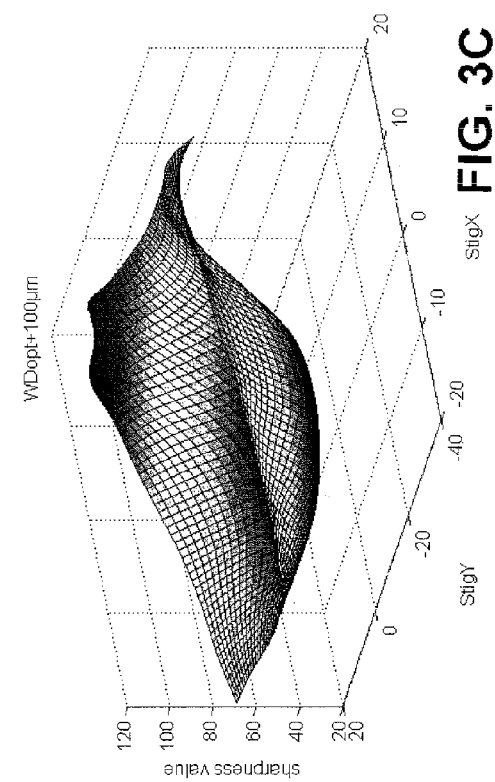

FIG. 3B is a graph similar to FIG. 3A, wherein the setting of the initial focus deviates from the optimum setting by +50 µm. It is apparent that the sharpness measure does not produce a maximum at the optimum settings of the x-stigmator and the y-stigmator at (0;0) and that the sharpness measure has two maxima at a distance from the optimum setting of the x-stigmator and the y-stigmator. It is possible in such situation that the optimization method proceeds towards one of these two maxima which are local maxima of the sharpness measure, and the optimization method might terminate at such local maximum and suggest that this local maximum represents the optimum setting of the focus, x-stigmator and y-stigmator.

Figure 3D:
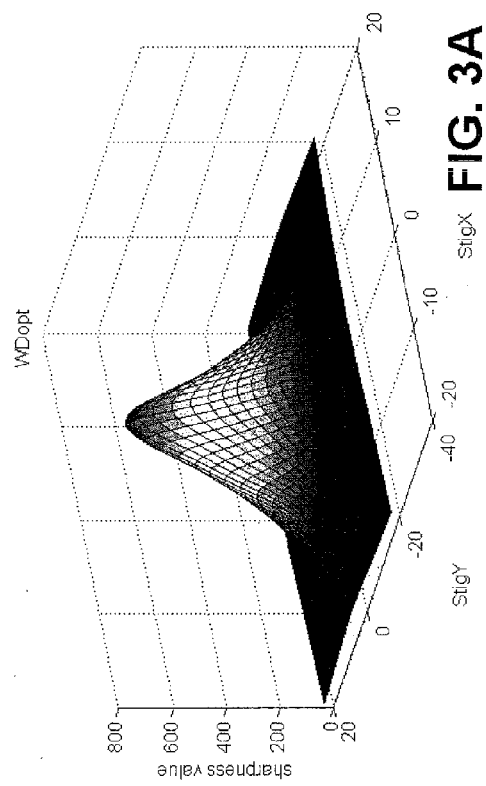
Figure 3C:
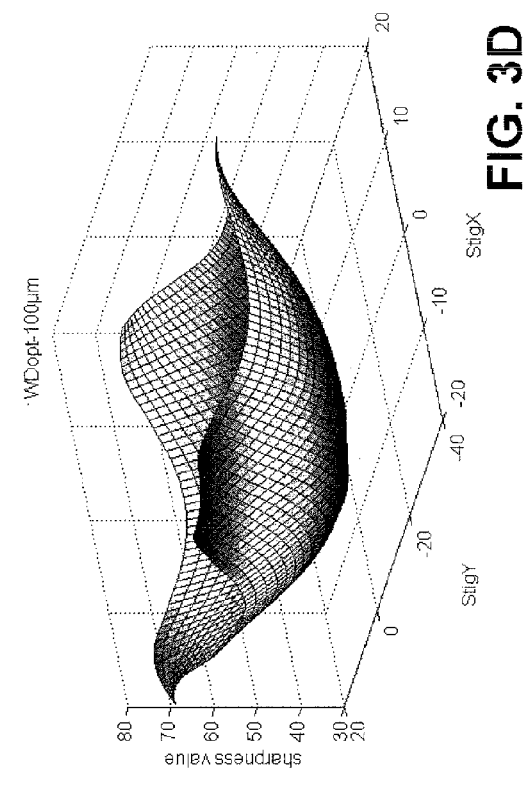

FIG. 3C is a graph similar to FIG. 3B, wherein the setting of the initial focus differs from the optimum setting by +100 µm. It is apparent that an optimization method using the illustrated sharpness measure might settle far away from the optimum settings of the x-stigmator and the y-stigmator.

FIG. 3D shows a further graph similar to those of FIGS. 3B and 3C, wherein the setting of the focus differs from the optimum setting by −100 µm. It is again apparent that the selected sharpness measure is not particularly useful for achieving the optimum setting in an automatic method.

A more suitable sharpness measure determined based on orientations of intensity gradients in a recorded image will be illustrated below.

Figure 4A:
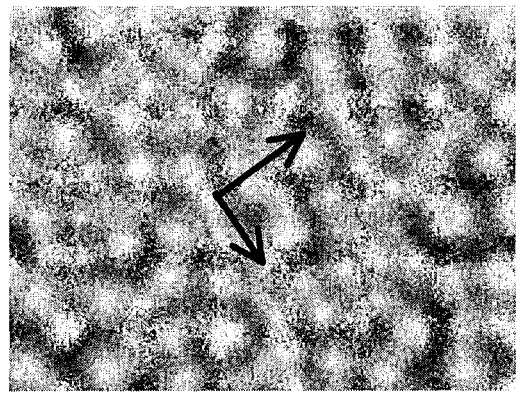
FIGS. 4A and 4B show images obtained at different settings.
Figure 4B:
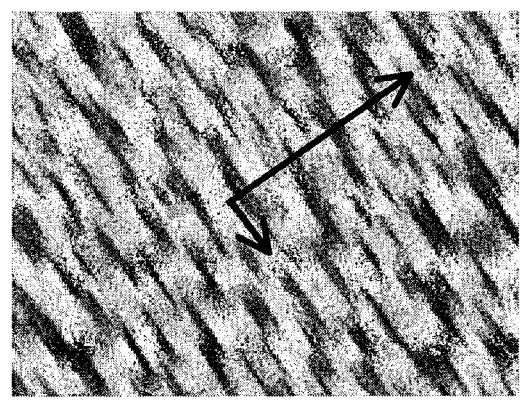

FIGS. 4A and 4B show two examples of unsharp or blurred images. The blur in FIG. 4A can be caused by a defocus or an astigmatism, wherein it is not possible to decide whether a defocus or an astigmatism causes the blur. The blur in FIG. 4B is caused by both a defocus and an astigmatism. If the images of FIGS. 4A and 4B were compared using the sharpness measure of the variance of the intensity gradients illustrated above, FIG. 4B would be "better" than the image of FIG. 4A since FIG. 4B has stronger intensity gradients.

The sharpness measure illustrated in the present embodiment is based on orientations of image properties.

FIG. 4B shows two arrows within the image. The longer arrow indicates a direction of the image in which most of the gradients in the image are orientated and which has the highest gradients, contrast or variance. The short arrow in FIG. 4B indicates a direction in the image into which the fewest number of gradients are oriented and which has smooth gradients and low contrast or variance.

FIG. 4A shows two arrows representing the directions with highest and lowest gradients, contrast or variance determined according to a same method as the two arrows in FIG. 4B. The two arrows of FIG. 4A have nearly the same lengths since the image does not apparently show an astigmatism.

The present optimization method uses the length of the shorter one of the two arrows as an input to the optimization method.

The two arrows are determined by analyzing the orientations of the intensity gradients at a plurality of locations of the image, such that the sharpness measure is determined based on the orientations of the intensity gradients at the plural locations of the image.

Moreover, a suitable function can be selected such that it depends on the orientation as an argument and has a minimum at those orientations into which the lowest number of intensity gradients are oriented. The number of intensity gradients oriented in this direction can be used as the sharpness measure. In FIG. 4B, the most intensity gradients are oriented in the direction of the long arrow and the fewest intensity gradients are oriented in the direction of the short arrow. According to one example, the sharpness measure is determined based on the short arrow, disregarding the long arrow, wherein the length of the arrow or value of the selected function is equal to the number of locations having the orientation gradients oriented in the direction of the short arrow. This length of the arrow or this function value can be used as the sharpness measure.

According to another example, the lengths of the two arrows are determined by calculating the sum of the amounts of the intensity gradients oriented in the respective direction. According to a still further example, the lengths of the two arrows are calculated by determining the average of the amounts of the intensity gradients oriented in the respective directions.

The sharpness measure can be determined based on the shorter of the two arrows, and the sharpness measure depends on the length of the shorter arrow such that a greater length results in a greater sharpness measure when the optimization method tries to find the maximum of the sharpness measure. For example, the sharpness measure can be proportional to the length of the shorter arrow.

According to other examples, the sharpness measure depends on both the shorter and the longer arrow such that, if the optimization method tries to find the maximum of the sharpness measure, a longer short arrow results in a greater sharpness measure and a longer long arrow results in a smaller sharpness measure. For example, the sharpness measure can be proportional to the length of the shorter arrow and inversely proportional to the length of the longer arrow.

FIGS. 5A to 5F, 7A-7F, 8A-8F, 9A-9F, and 10A-10F illustrate five different focusing states of a beam used for recording images of a same sample.

Figure 5A:
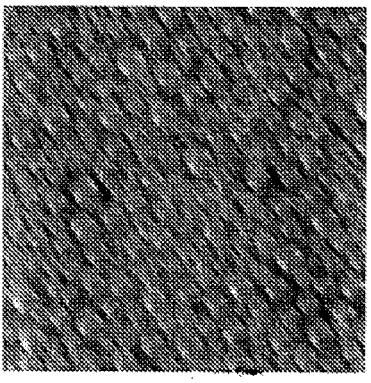
Figure 5B:
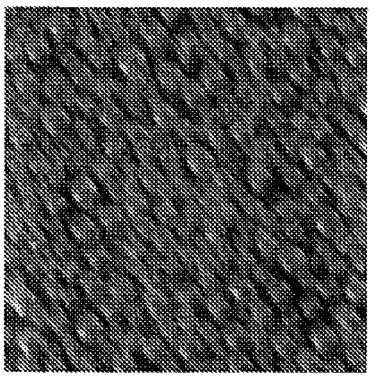
Figure 5C:
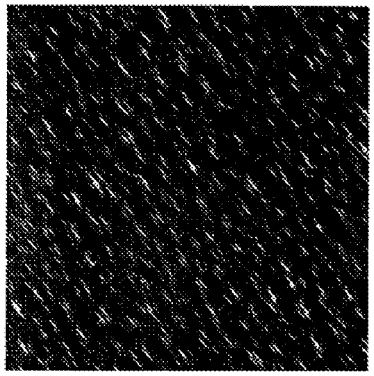

FIG. 5A shows an image as recorded with a given setting of the focus, x-stigmator and y-stigmator. The recorded image undergoes some image processing and is in particular smoothed in order to produce a processed image as shown in FIG. 5B. The gradients at each location of the processed image are calculated in order to produce a gradient image which is shown in FIG. 5C. The gradient image can be calculated by applying the Sobel operator, for example, to the processed image.

Figure 5D:
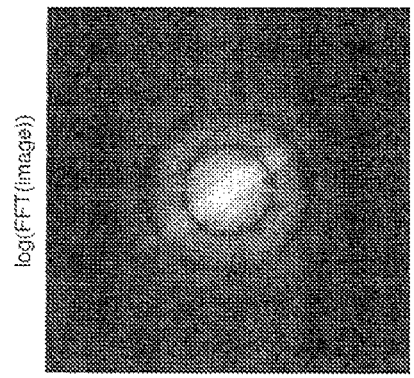
Figure 5E:
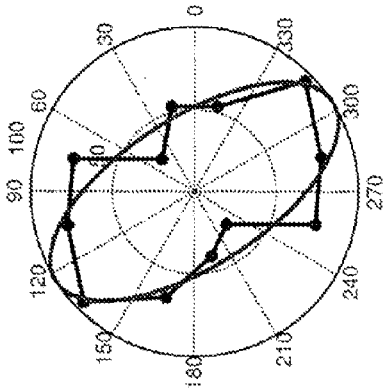

FIG. 5E shows a polar diagram with data points and an ellipse fitted to the data points. Each data point is determined as follows: the data point at 15°, for example, is calculated based on all pixels in the gradient image at which the intensity gradient is oriented in directions within the range from 0° to 30°. This means that a data binning is performed with respect to the orientations of the intensity gradients. It is apparent that a higher or lower number of data points can be used in the polar diagram by using smaller or greater angular ranges (bins).

The amount or radius of each data point in FIG. 5E is determined by calculating the average of the intensity gradients at those locations having the intensity gradient oriented in the respective angular range (bin).

An ellipse is fitted to the data points, and the orientation of the long axis and the short axis can be readily determined from this ellipse. The short arrow corresponding to FIG. 4 can be determined such that it is oriented along the short axis of the ellipse wherein the length of the arrow corresponds to the radius of the ellipse as measured along the short axis. The long arrow corresponding to FIG. 4 can be determined such that its length is equal to the radius of the ellipse as measured along the long axis. The sharpness measure can be calculated from the thus determined short and long arrows as illustrated above.

The determination of the sharpness measure as illustrated in this embodiment so far is based on the plurality of orientations of an intensity gradient determined at a plurality of locations of the recorded image or a processed image generated by processing the recorded image. According to an alternative embodiment, the sharpness measure is determined based on an orientation of an image property of a Fourier transformed image generated by Fourier transforming one of the recorded image and a processed image generated by processing the recorded image.

FIG. 5D shows an image generated by Fourier transforming the smoothed image of FIG. 5B.

It is apparent that the image intensities of the Fourier transformed image depend on an orientation about a center of the Fourier transformed image. In the present example, the center of the Fourier transformed image corresponds to a spatial frequency of zero in the recorded image (FIG. 5A) or processed image (FIG. 5B) from which the Fourier transformed image was generated.

The sharpness measure can be determined by determining a first orientation such that a function depending on the orientation as an argument has a minimum at the first orientation, wherein the function depends on image intensities at each of a plurality of locations within the Fourier transformed image located, with respect to a center of the Fourier transformed image, within an orientation interval about the orientation argument.

Figure 5F:
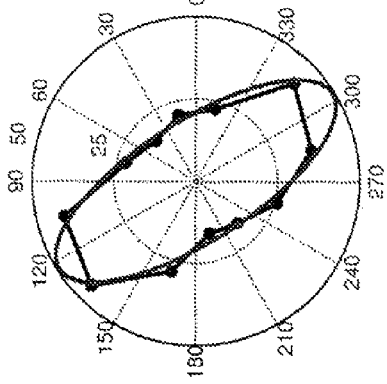

In the illustrated example, the function is selected such that the function value is calculated by summing the image intensities of the Fourier transformed image of locations which are located, relative to the center of the Fourier transformed image, within an orientation interval of e.g. 30° about the function argument FIG. 5F shows a polar diagram in which the data points represent the function values of the above function applied to the Fourier transformed image of FIG. 5D. FIG. 5F also shows an ellipse fitted to these data points.

The ellipse fitted to the data points of FIG. 5F has similar properties as the ellipse fitted to the data points of FIG. 5E. In particular, the orientations of the long and short axes of the ellipses and the eccentricities of the ellipses are substantially the same. As a consequence, the processing of the Fourier transformed image as illustrated above is similarly suited for determining a sharpness measure of the recorded image based on orientations of image properties. In particular, the orientation of the long axis and the short axis can be readily determined from the ellipse of FIG. 5F. A short arrow corresponding to FIG. 4 can be determined such that it is oriented along the short axis of the ellipse wherein the length of the arrow corresponds to the radius of the ellipse as measured along the short axis. The long arrow corresponding to FIG. 4 can be determined such that its length is equal to the radius of the ellipse as measured along the long axis. The sharpness measure can be calculated from the thus determined short and long arrows as illustrated above.

The difference in the lengths of the short and the long arrows or the ratio of the lengths of the short and the long arrows determined based on the ellipses of FIG. 5E or 5F is indicative of an astigmatism in the image. FIGS. 7A-7F illustrate a focusing state having a lower astigmatism than the focusing state illustrated in FIGS. 5A-5F.

FIGS. 8A-8F are similar to FIGS. 5A-5F, respectively but differ with respect to the orientation of the astigmatism.

FIGS. 9A-9F are similar to FIGS. 8A-8F, but have a smaller astigmatism.

FIGS. 10A-10F are similar to FIGS. 5A-5F and 8A-8F but have a low astigmatism and are relatively sharp in two independent directions. Short and long arrows determined from the ellipses in FIGS. 10E and 10 F have nearly the same length, wherein this length is also the maximum length obtainable in the optimization method such that FIGS. 10A-10F illustrate the best achievable focusing state.

FIG. 6 is an illustration similar to FIG. 3 showing the sharpness measure in dependence of the values of the x-stigmator and the y-stigmator for different values of the initial focus. The sharpness measure is determined based on short and long arrows as illustrated above, wherein the sharpness measure is calculated as the length of the short arrow divided by the length of the long arrow, wherein the lengths of the short and long arrows are calculated as the average amount of the intensity gradients oriented in the respective directions.

Figure 6A:
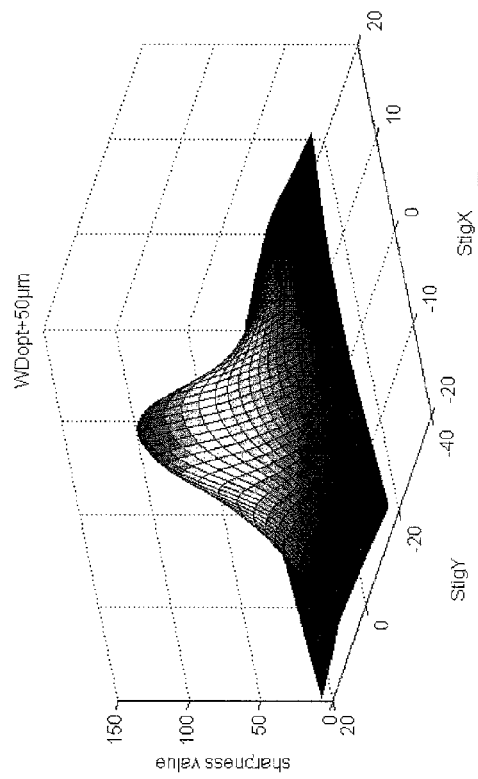
FIGS. 6A to 6D are graphs illustrating a sharpness measure illustrated in FIGS. 5A to 5F, 7A-7F, 8A-8F, 9A-9F, and 10A-10F.
Figure 6B:
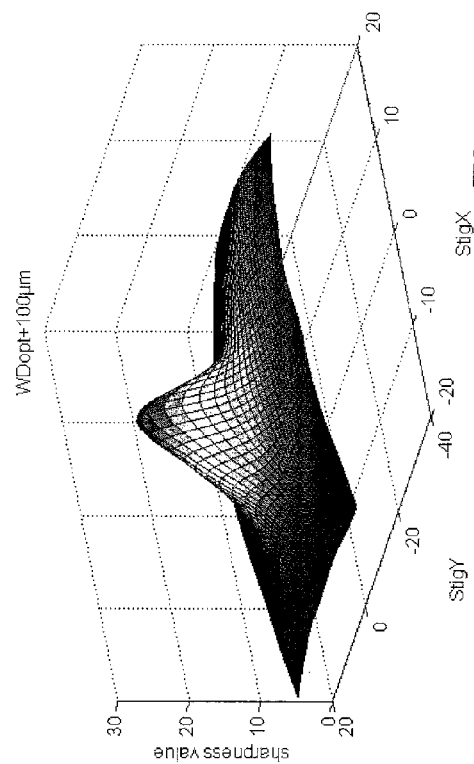
Figure 6C:
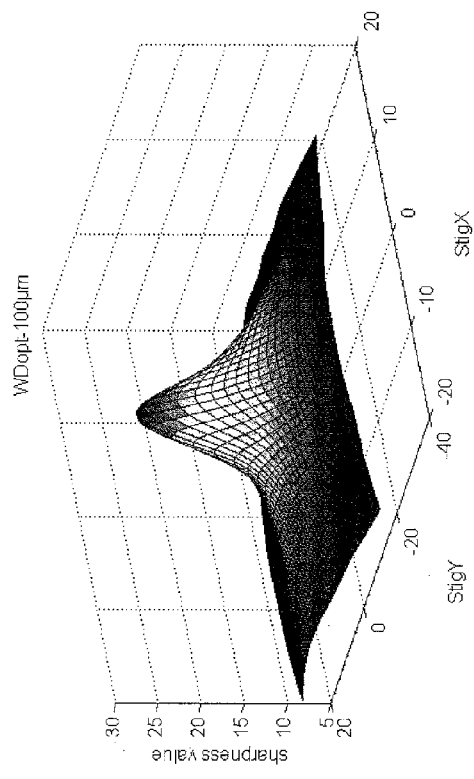
Figure 6D:
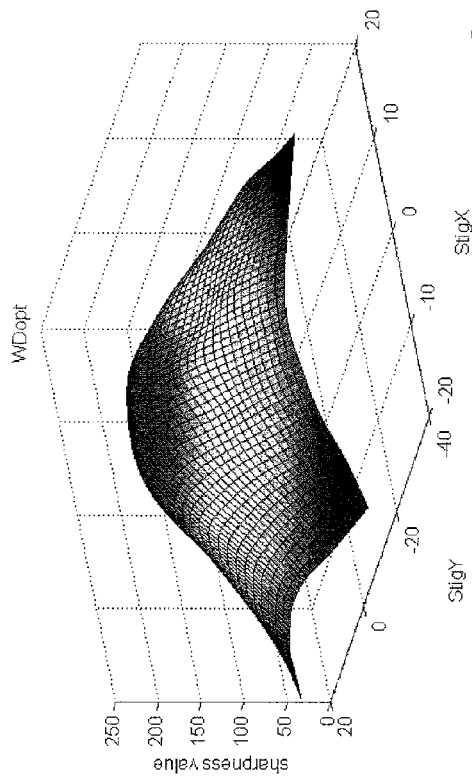
Figure 7A:
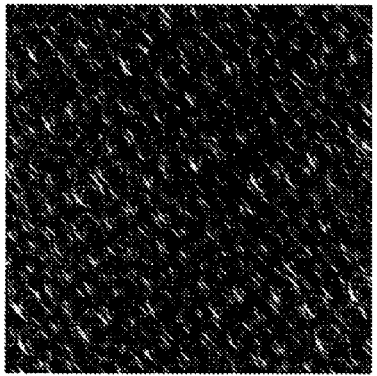
Figure 7B:
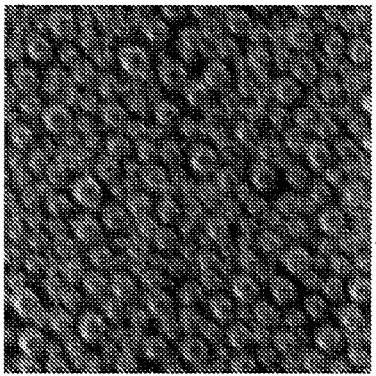
Figure 7C:
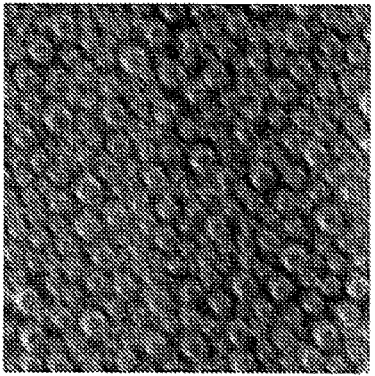
Figure 7D:
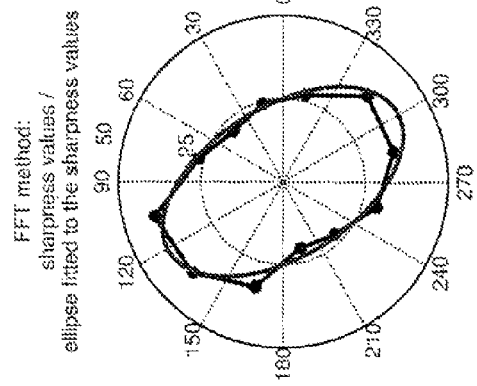
Figure 7E:
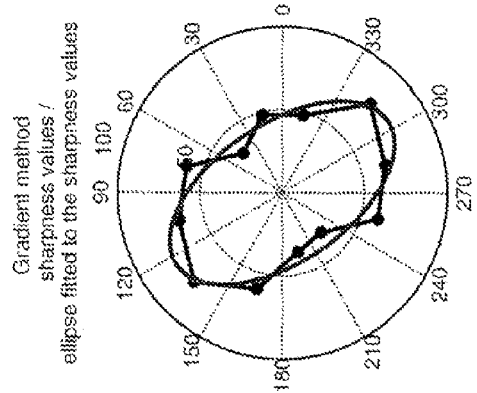
Figure 7F:
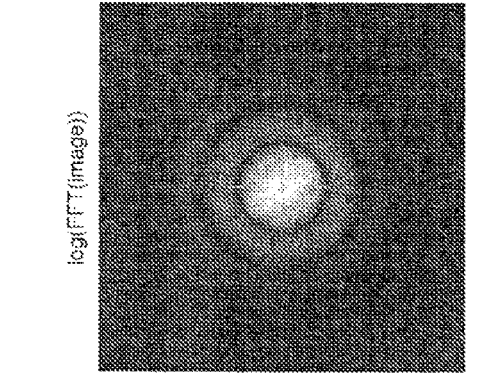
Figure 8A:
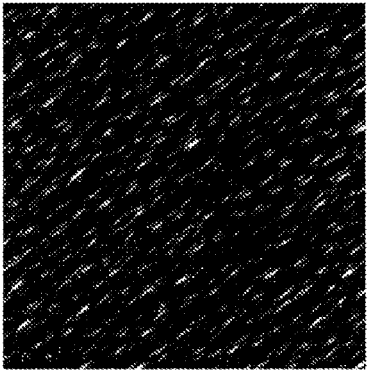
Figure 8B:
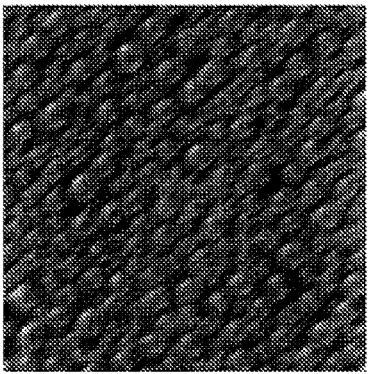
Figure 8C:
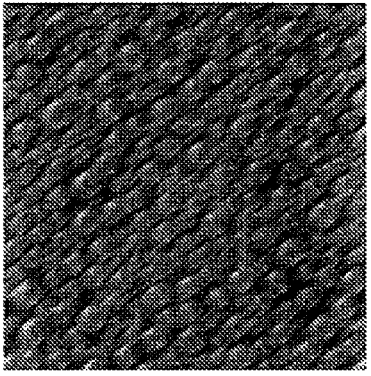
Figure 8D:
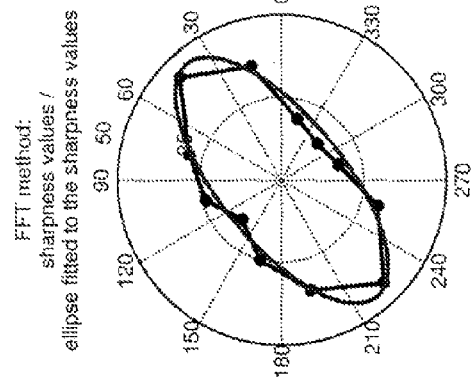
Figure 8E:
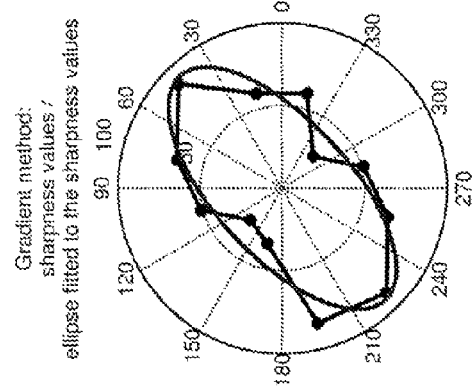
Figure 8F:
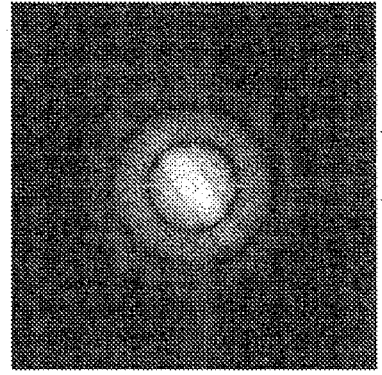
Figure 10A:
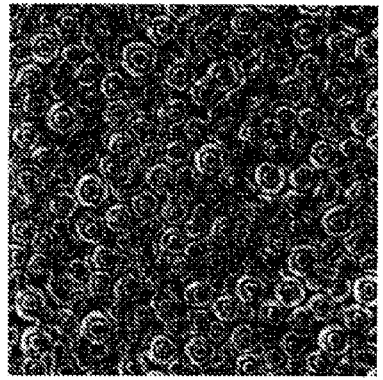
Figure 10B:
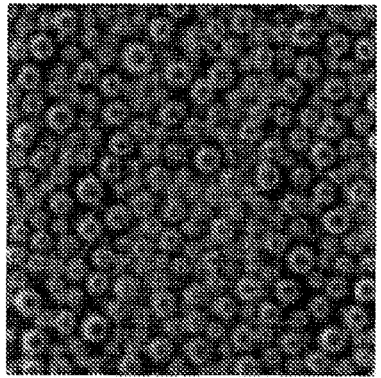
Figure 10C:
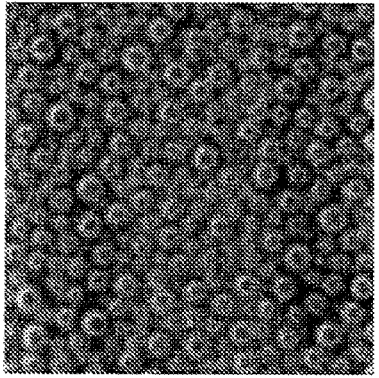
Figure 10D:
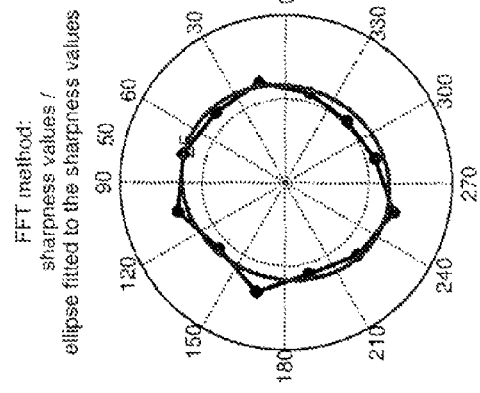
Figure 10E:
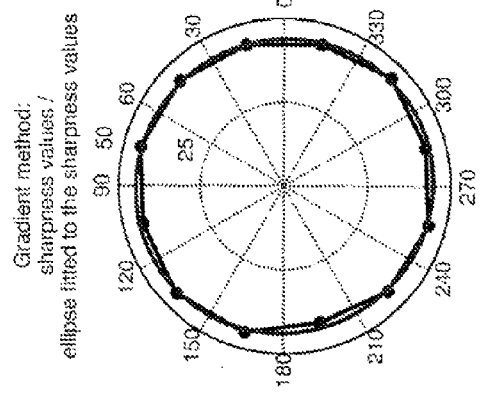
Figure 10F:
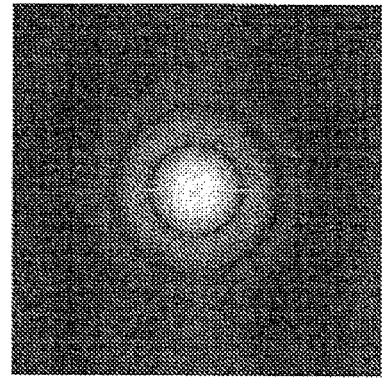

It is apparent from FIGS. 6A to 6C that an optimization method will easily find the optimum settings for the x- and y-stigmator for each initial value of the focus.

The embodiments illustrated above relate to a scanning electron microscope (SEM). However, it is possible to apply the illustrated principles of focusing a particle beam to an ion beam of a gas field ion microscope (GFIM). The charged particle lenses used in a charged particle microscope are not limited to the magnetic condenser and objective lenses of the embodiment illustrated above and may also include electrostatic lenses and combinations of magnetic lenses and electrostatic lenses.

While the disclosure has been described with respect to certain exemplary embodiments thereof, it is evident that many alternatives, modifications and variations will be apparent to those skilled in the art. Accordingly, the exemplary embodiments of the disclosure set forth herein are intended to be illustrative and not limiting in any way. Various changes may be made without departing from the spirit and scope of the present disclosure as defined in the following claims.

What is claimed is:

1. A method of operating a charged particle microscope, the method comprising:
   providing settings of a focus, an x-stigmator and an y-stigmator of the charged particle microscope; and then
   repeatedly performing
     adjusting the charged particle microscope to the settings,
     recording an image of an object using the settings,
     determining a sharpness measure of the image as a whole from the recorded image, the sharpness measure indicating an overall sharpness of the recorded image, and
     changing at least one of the settings of the focus, the x-stigmator and the y stigmator based on the sharpness measure
   until a stop criterion is fulfilled;
   wherein the determining of the sharpness measure comprises:
     determining an orientation of an intensity gradient at each of a plurality of locations within one of the recorded image and a processed image generated by processing the recorded image, and
     determining the sharpness measure based on the plurality of determined orientations.

2. The method of claim 1, wherein the determining of the sharpness measure comprises determining a first orientation such that a function depending on the orientation as an argument has a minimum at the first orientation, wherein the function depends on a number of locations of the plurality of locations at which the determined orientation of the intensity gradient is within an orientation interval about the orientation argument.

3. The method of claim 1, wherein the determining of the sharpness measure comprises determining a first orientation such that a function depending on the orientation as an argument has a minimum at the first orientation, wherein the function depends on a sum of amounts of the intensity gradients at the locations at which the determined orientation of the intensity gradient is within an orientation interval about the orientation argument.

4. The method of claim 2, wherein the function depends on an average of amounts of the intensity gradients at the locations at which the determined orientation of the intensity gradient is within the orientation interval about the orientation argument.

5. The method of claim 2, wherein the sharpness measure depends on a value of the function at the minimum.

6. The method of claim 5, wherein the sharpness measure is proportional to the value of the function at the minimum.

7. The method of claim 5, wherein the determining of the sharpness measure comprises determining a second orientation such that the function depending on the orientation as an argument has a maximum at the second orientation, and wherein the sharpness measure depends on a value of the function at the maximum.

8. The method of claim 7, wherein the sharpness measure is inversely proportional to the value of the function at the maximum.

9. The method of claim 7, wherein the stop criterion is fulfilled when a difference between the value of the function at the maximum and the value of the function at the minimum is below a threshold.

10. The method of claim 1, wherein the processing of the recorded image comprises generating a Fourier transform.

11. The method of claim 1, wherein the processing of the recorded image comprises a smoothing step.

12. The method of claim 1, wherein the changing the settings based on the sharpness measure is performed using an optimization method for non-linear functions having at least one parameter, wherein at least one value of the at least one setting of the focus, the x-stigmator and the y-stigmator is used as the at least one parameter of the non-linear function.

13. The method of claim 12, wherein the optimization method is a downhill simplex method.

14. The method of claim 1, wherein the stop criterion is fulfilled when an absolute value of a difference between the sharpness measure of a current repetition and the sharpness measure of a previous repetition is below a threshold.

15. The method of claim 1, further comprising, when the stop criterion is fulfilled, recording at least one image of the object using the settings.

16. A charged particle microscope, comprising:
   a charged particle source generating a charged particle beam;
   at least one focusing lens traversed by the charged particle beam, the at least one focusing lens including an objective lens focusing the charged particle beam at a working distance from the objective lens;
   an x-stigmator traversed by the particle beam;
   an y-stigmator traversed by the particle beam;
   an object mount configured to hold the object at a distance from the objective lens; and
   a controller configured to provide settings of a focus, an x-stigmator and an y-stigmator of the charged particle microscope, and
   to repeatedly perform:
     adjusting the charged particle microscope to the settings,
     recording an image of an object using the settings,
     determining a sharpness measure of the image as a whole from the recorded image, the sharpness measure indicating an overall sharpness of the recorded image, and
     changing at least one of the settings based on the sharpness measure, until a stop criterion is fulfilled;
   wherein the determining of the sharpness measure comprises:
     determining an orientation of an intensity gradient at each of a plurality of locations within one of the recorded image and a processed image generated by processing the recorded image, and
     determining the sharpness measure based on the plurality of determined orientations; and
   wherein the adjusting of the charged particle microscope to the settings includes at least one of adjusting at least one of an excitation of the at least one focusing lens and a distance of the object mount from the objective lens according to the setting of the focus, adjusting an excitation of the x-stigmator according to the setting of the x-stigmator, and adjusting an excitation of the y-stigmator according to the setting of the y-stigmator.

17. The charged particle microscope of claim 16, wherein the determining of the sharpness measure comprises determining a first orientation such that a function depending on the orientation as an argument has a minimum at the first orientation, wherein the function depends on a sum of amounts of the intensity gradients at the locations at which the determined orientation of the intensity gradient is within an orientation interval about the orientation argument.

18. The charged particle microscope of claim 17, wherein the function depends on an average of amounts of the intensity gradients at the locations at which the determined orientation of the intensity gradient is within the orientation interval about the orientation argument.

19. The charged particle microscope of claim 17, wherein the sharpness measure depends on a value of the function at the minimum.

20. The charged particle microscope of claim 19, wherein the sharpness measure is proportional to the value of the function at the minimum.

21. The charged particle microscope of claim 19, wherein the determining of the sharpness measure comprises determining a second orientation such that the function depending on the orientation as an argument has a maximum at the second orientation, and wherein the sharpness measure depends on a value of the function at the maximum.

22. The charged particle microscope of claim 21, wherein the sharpness measure is inversely proportional to the value of the function at the maximum.

23. The charged particle microscope of claim 21, wherein the stop criterion is fulfilled when a difference between the value of the function at the maximum and the value of the function at the minimum is below a threshold.

24. The charged particle microscope of claim 16, wherein the processing of the recorded image comprises generating a Fourier transform.

25. The charged particle microscope of claim 16, wherein the processing of the recorded image comprises a smoothing step.

26. The charged particle microscope of claim 16, wherein the changing the settings based on the sharpness measure is performed using an optimization method for non-linear functions having at least one parameter, wherein at least one value of the at least one setting of the focus, the x-stigmator and the y-stigmator is used as the at least one parameter of the non-linear function.

27. The charged particle microscope of claim 26, wherein the optimization method is a downhill simplex method.

28. The charged particle microscope of claim 16, wherein the stop criterion is fulfilled when an absolute value of a difference between the sharpness measure of a current repetition and the sharpness measure of a previous repetition is below a threshold.

29. The charged particle microscope of claim 16, wherein when the stop criterion is fulfilled, at least one image of the object is recorded using the settings.

* * * * *